United States Patent [19]
Newton et al.

[11] Patent Number: 5,455,385
[45] Date of Patent: Oct. 3, 1995

[54] MULTILAYER LTCC TUB ARCHITECTURE FOR HERMETICALLY SEALING SEMICONDUCTOR DIE, EXTERNAL ELECTRICAL ACCESS FOR WHICH IS PROVIDED BY WAY OF SIDEWALL RECESSES

[75] Inventors: Charles M. Newton, Palm Bay; Edward G. Palmer, Melbourne; Albert Sanchez; Christopher A. Myers, both of Palm Bay, all of Fla.

[73] Assignee: Harris Corporation, Melbourne, Fla.

[21] Appl. No.: 84,665

[22] Filed: Jun. 28, 1993

[51] Int. Cl.$^6$ .......................... H01L 23/02; H01L 23/12; H01L 23/14/23/32
[52] U.S. Cl. .................. 174/52.4; 361/735; 257/686; 257/693; 257/700; 257/705
[58] Field of Search ................... 174/52.4, 52.1, 174/52.5; 361/728, 729, 730, 731, 735, 737, 761; 257/685, 686, 690, 692, 693, 698, 700, 705, 707, 723, 678

[56] References Cited

U.S. PATENT DOCUMENTS

| | | | |
|---|---|---|---|
| 3,370,203 | 2/1968 | Kravitz | 361/730 |
| 3,927,815 | 12/1975 | Mase | 228/121 |
| 4,608,592 | 8/1986 | Miyamoto . | |
| 4,630,172 | 12/1986 | Stenerson | 361/386 |
| 4,635,093 | 1/1987 | Ross | 361/761 |
| 4,646,128 | 2/1987 | Carson et al. | 357/74 |
| 4,705,917 | 11/1987 | Gates, Jr. | 361/794 |
| 4,764,846 | 8/1988 | Go | 361/388 |
| 4,799,984 | 1/1989 | Rellick | 156/89 |
| 4,806,188 | 2/1989 | Rellick | 156/89 |
| 4,894,706 | 1/1990 | Sato et al. | 357/72 |
| 5,043,794 | 8/1991 | Tai | 357/74 |
| 5,058,265 | 10/1991 | Goldfarb | 29/852 |
| 5,128,831 | 7/1992 | Fox, III et al. | 361/396 |

FOREIGN PATENT DOCUMENTS

| | | | |
|---|---|---|---|
| 725834 | 1/1966 | Canada | 361/761 |
| 0023400 | 2/1981 | European Pat. Off. . | |
| 52-58468 | 5/1977 | Japan | 257/700 |
| 105656 | 8/1981 | Japan | 257/705 |
| 160641 | 8/1985 | Japan | 257/686 |
| 0269967 | 3/1990 | Japan | 257/685 |
| 2229461 | 9/1990 | Japan | 257/686 |
| 3161956 | 7/1991 | Japan | 257/705 |
| 2077036 | 12/1981 | United Kingdom . | |
| 2138210 | 10/1984 | United Kingdom | 257/705 |
| 2233821 | 1/1991 | United Kingdom | 257/705 |
| 8100949 | 4/1981 | WIPO . | |
| 9007793 | 7/1990 | WIPO . | |

Primary Examiner—Leo P. Picard
Assistant Examiner—Stephen T. Ryan
Attorney, Agent, or Firm—Charles E. Wands

[57] ABSTRACT

A packaging assembly for a semiconductor circuit chip is formed of a hermetically sealable, 'tub'-like structure. The tub-like structure is comprised a laminated stack of thin layers of low temperature co-fired ceramic (LTCC) material. The laminated stack of LTCC layers contains an internally distributed network of interconnect links through which a semiconductor die, that has been mounted at a floor portion of the tub, may be electrically connected to a plurality of conductive recesses or pockets located at top and bottom sidewall edge portions of the tub, thereby allowing multiple tubs to be joined together as a hermetically sealed assembly and electrically interconnected at the conductive pockets of adjacent tubs.

17 Claims, 5 Drawing Sheets

MULTILAYER LTCC TUB ARCHITECTURE FOR HERMETICALLY SEALING SEMICONDUCTOR DIE, EXTERNAL ELECTRICAL ACCESS FOR WHICH IS PROVIDED BY WAY OF SIDEWALL RECESSES

FIELD OF THE INVENTION

The present invention relates in general to integrated circuit chip packaging assemblies and is particularly directed to a new and improved hermetically sealable, 'tub'-like structure that is formed of a laminated stack of thin layers of low temperature co-fired ceramic material, the laminated stack containing an internally distributed network of interconnect links through which a semiconductor die, that has been mounted at a floor portion of the tub, may be electrically connected to a plurality of conductive recesses or pockets located at top and bottom sidewall edge portions of the tub, thereby allowing multiple tubs to be joined together as a hermetically sealed assembly and electrically interconnected at the conductive pockets of adjacent tubs.

BACKGROUND OF THE INVENTION

Among the requirements of variety of microelectronic circuit components and systems, such as those deployable in harsh (spaceborne) operating environments, are the need for the circuit-containing modules to be hermetically sealed and to have a high packing density (minimum volume). For this purpose, the integrated circuit chip packaging industry has developed a number of 'edge'-connected multi-chip assembly architectures through which a plurality of leadless chip carriers (LCCs) or a plurality of semiconductor (silicon) dies are arranged in a stacked configuration on a printed wiring board and interconnected by means of some form of thin film metallization or tape automated bonding (TAB) lead structure that extends across the aligned edges of the stack. Examples of these packaging schemes (such as those employed for the packaging of silicon memory chips) include vertical post and flat pack style LCC stacks developed by Dense-Pac Corporation, Garden Grove, Calif., 'Stacked TAB' devices produced by Matsushita Corp., Japan, and a variety of three-dimensional 'cubes' proposed by Texas Instruments and Irvine Sensors.

A problem with each of these packaging architectures is their complexity and significant expense of manufacture, in particular the high cost of formation of a thin film metallization along the sides or edges of the stacked components (either LCCs or the silicon die themselves), and the cost and volume of additional structure required to house an interconnected stack in a hermetically sealed package.

SUMMARY OF THE INVENTION

In accordance with the present invention, the above described shortcomings of conventional multi-chip packaging architectures are successfully remedied by a new and improved hermetically sealable, 'tub'-like structure, that is configured to allow multiple die-containing tubs to be joined together in a hermetically sealed stack and electrically interconnected at conductive pockets formed at top and bottom sidewall edge portions of adjacent tubs.

For this purpose, the tub-like packaging architecture of the present invention comprises a lamination of multiple, very thin layers of low temperature co-fired ceramic (LTCC) material, which are capable of being hermetically sealed and are well suited for use in a severe operating environment, such is encountered in spaceborne applications. The typical thickness of an individual LTCC layer may be on the order of three to four mils. As an alternative material, in place of low temperature co-fired ceramic (LTCC) material, high temperature co-fired ceramic may be used.

The configuration of an individual tub is defined by a floor portion, upon which a semiconductor circuit chip is mounted, and a surrounding wall portion, which is adjacent to and defines the perimeter of the floor portion. The floor portion of the tub comprises a bottom LTCC layer and an immediately adjacent layer, which is disposed atop the bottom layer. The bottom surface of the bottom layer of the floor portion forms the bottom surface of the tub, while a generally centrally located region of the top surface of the adjacent floor layer forms the mounting surface for a semiconductor circuit chip (die). The die is preferably mechanically secured to the top surface of the floor portion by means of non-organic silver/glass die attachment material. The terminal pads of a respective die are typically distributed around the periphery of its top surface for connection to a lead distribution network through which external access to the chip is provided.

The wall portion of the tub that surrounds the die-mounting floor portion comprises an inner wall portion extending a first height above the floor portion, and an adjoining outer wall portion extending a second height above the floor portion, greater than the height of and adjoining the inner wall portion. The inner wall portion is formed of plural ones of the LTCC layers. Each of these layers has the shape of an annular frame, defined by an inner edge and an outer edge which is aligned with outer edges of the (two) layers of the floor portion of the tub.

Distributed along the top surface of the top layer of the inner wall portion are a plurality of contact regions, which are disposed in proximity of the terminal pads of the chip. The contact regions are selectively electrically connected to the chip's terminal pads by means of connection leads that are bonded between the chip terminal pads and the distributed contact regions of the inner wall frame. The contact regions are electrically connected to an internal network of conductive vias and electrical interconnect tracks, that terminate at conductive recesses or pockets distributed along an outer edge or sidewall surface of each of the top and bottom layers of the outer wall portion of the tub.

The outer wall portion of a tub is formed of additional LTCC layers, including a top layer and an immediately adjacent layer. Each of these additional layers has the shape of an annular frame defined by an inner edge and an outer edge, the inner edge being set back from the inner edge of the inner wall portion adjacent to the die, so as to allow for the placement of contact regions on the top surface of the inner wall portion adjacent to the terminal pads of the die, and the outer edge being aligned with the outer edges of the other layers of the tub.

Each of the pockets or recesses that are distributed along an outer edge or sidewall surface of each of the top and bottom layers of the outer wall portion exposes a peripheral surface portion of the top surface of the immediately adjacent layer on which a layer of electrical interconnect has been formed. This interconnect layer forms part of the electrical interconnect network distributed through the tub. The interconnect layer may extend from the exposed surface portion to a conductive via that passes through plural ones of the LTCC layers of the outer wall portion, intermediate the top layer and the bottom layer of the stacked laminate structure. The conductive vias in the outer wall portion may terminate at the bottom layer of the tub. A layer of electrical interconnect metal is printed on the bottom surface of the next-to-bottom LTCC layer, and extends from a conductive via to a surface portion of the bottom surface of the next-to-bottom layer exposed by a pocket in the bottom layer.

Since the conductive via in the outer wall portion is connected to the conductive via in the inner wall portion by way of the printed interconnect metal extending along a surface of one of the layers of the inner wall portion, a dual interconnect path is provided between each terminal pad of a die and the exposed portions of interconnect layers at the top and bottom peripheral edge of the tub where the recesses are provided. This allows the tubs to be stacked on top of one another and the chips that have been mounted on the floor portions of the tubs to be electrically interconnected by the application of conductive material, such as conductive epoxy, to selected ones of aligned pockets located at mutually abutting top/bottom and bottom/top sidewall edge portions of the tubs.

A mechanical bonding layer material such as a glass frit is applied between the bottom surface of one tub and the top surface of the outer wall portion of another tub, so that, when fired, the glass provides a secure mechanical attachment between adjacent tubs and also hermetically seals the die that have been mounted on the interior floor portions of the tubs. The topmost tub of a stack of tubs may be hermetically sealed by means of an LTCC lid layer, to complete the packaging assembly.

DETAILED DESCRIPTION

Figure 1:
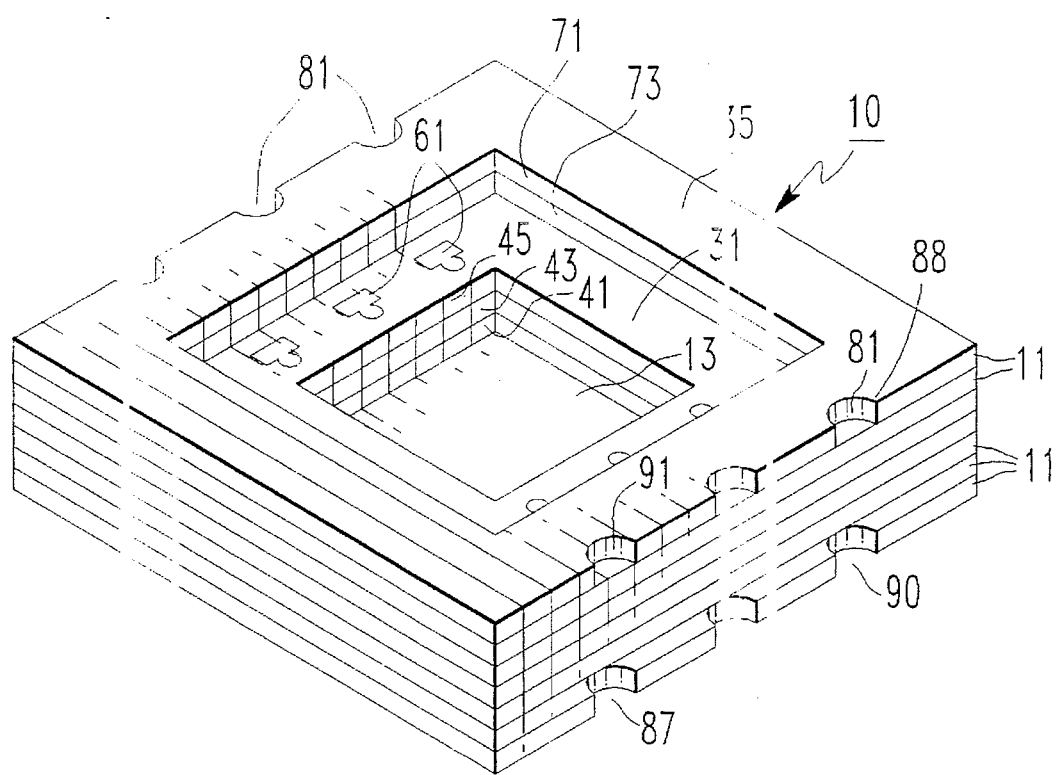
FIG. 1 is a diagrammatic perspective view of an individual chip-retaining multilayer LTCC tub architecture in accordance with an embodiment of the present invention.
Figure 2:
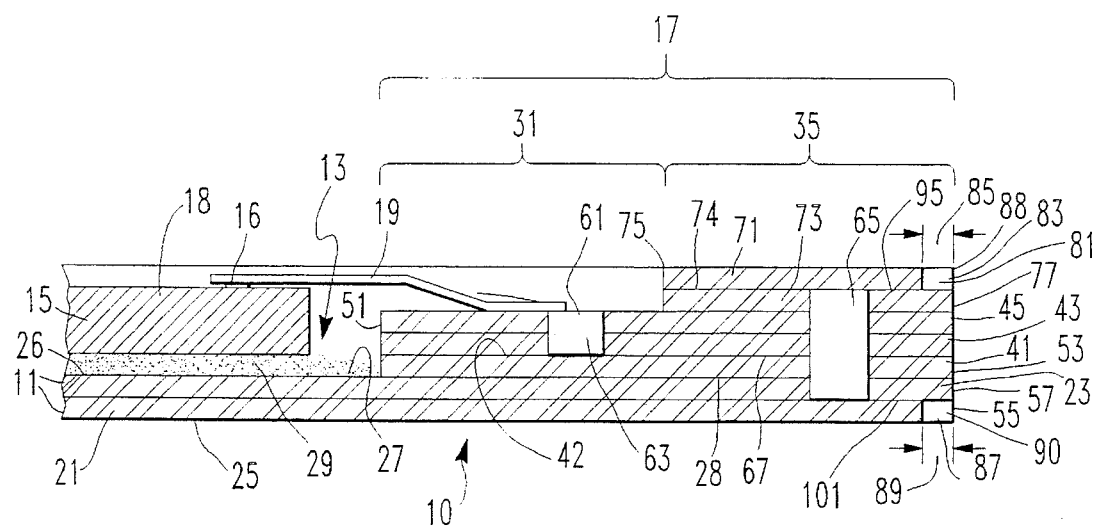
FIG. 2 is a diagrammatic sectional view of the multilayer LTCC tub architecture of FIG. 1.
Figure 3:
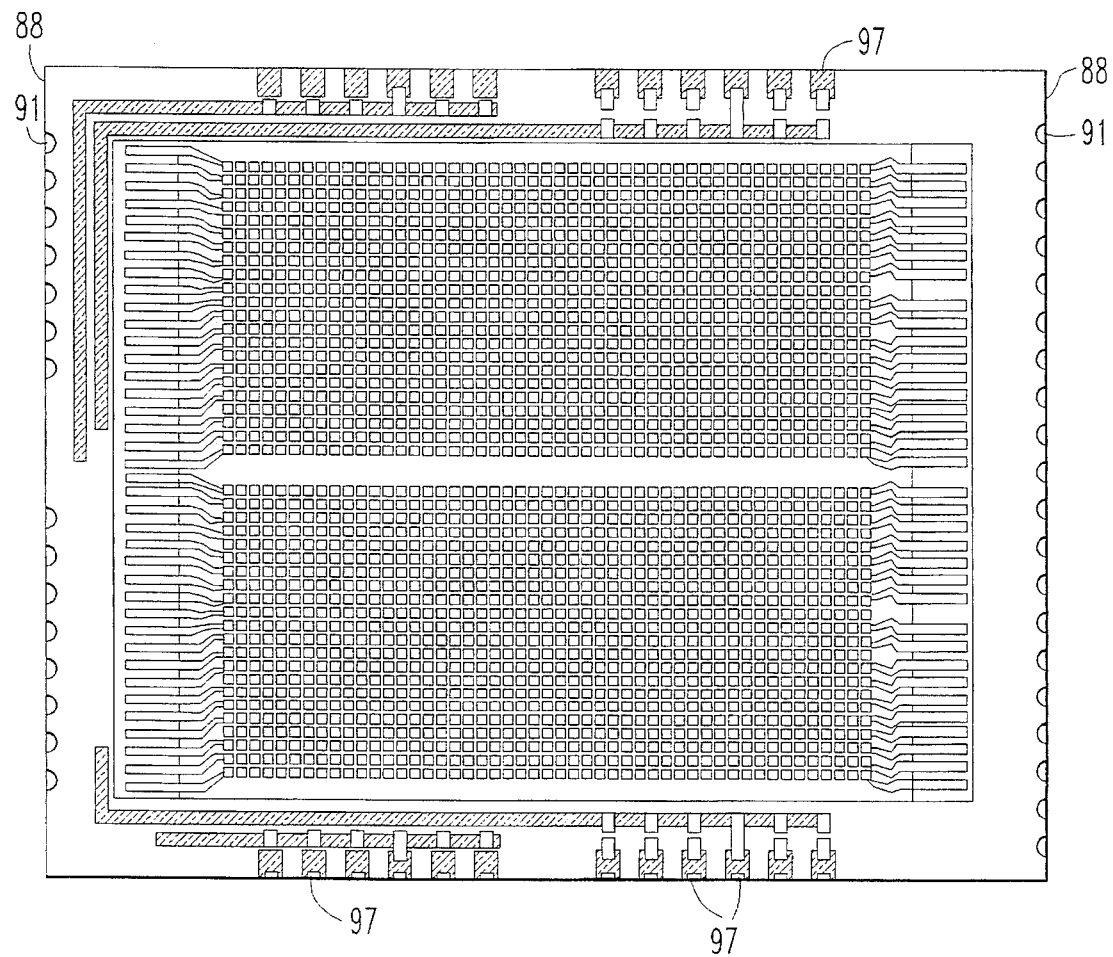
FIG. 3 a diagrammatic plan view of the multilayer LTCC tub of FIG. 2.

Referring initially to the diagrammatic perspective view of FIG. 1, the sectional view of FIG. 2 and the plan view of FIG. 3, an individual semiconductor chip-retaining tub 10 of the package assembly of the present invention is shown as comprising a stacked laminate of a plurality of thin dielectric layers 11. Preferably, layers 11 are made of low temperature co-fired ceramic (LTCC) material, commonly known as 'Green Tape' (Trademark, dupont Corp.), which is capable of being hermetically sealed and is well suited for use in severe operating environments, such as spaceborne applications. The typical thickness of an individual layer 11 may be on the order of three to four mils. The composition of an LTCC Green Tape layer includes acrylic binders (which hold the tape together in its unfired state and provide adhesion between adjacent layers), glass and ceramic material. During the firing process the acrylic binders typically burn off at a temperature on the order of 400° C., while the glass melts at a temperature on the order of 850° C., leaving a solid glass/ceramic structure.

The configuration of an individual tub 10 is defined by a floor portion 13, upon which a semiconductor circuit chip or die 15 is mountable, and a surrounding wall portion 17, which is adjacent to and defines the perimeter of the floor portion 13. The floor portion of the tub is shown as comprising two of the layers 11, specifically a bottom layer 21 and an immediately adjacent layer 23, which is disposed atop bottom layer 21. The bottom surface 25 of bottom layer 21 forms the bottom surface of the tub 10, while a generally centrally located region 26 of the top surface 27 of layer 23 forms the mounting surface for die 15. Die 15 may be mechanically attached to layer 23 by means of a layer 29 of non-organic silver/glass die attachment material which, in addition to securing the die to the tub floor, provides a thermal flow path for removing heat from the die through the underlying tub floor. Layer 29 may have a thickness on the order of two to four mils. A respective die 15 typically has a plurality of terminal pads, one of which is shown at 16 in FIG. 2, distributed around the periphery of its top surface 18, through which electrical connections to the circuitry of the chip are provided.

The wall portion 17 of the tub comprises a first, inner wall portion 31 extending a first height 33 above the floor portion 13, and an adjoining second, outer wall portion 35 extending a second height 37 above the floor portion, greater than the first height. The first, inner wall portion 31 is shown as being formed of plural ones of the co-fired ceramic layers 11, specifically a bottom layer 41, and intermediate layer 43 and a top layer 45. Each of layers 41, 43 and 45 has the shape of an annular frame defined by an inner edge 51 and an outer edge 53, which is aligned with outer edges 55 and 57 of the two bottom layers 21 and 23, respectively. Distributed along the top surface 47 of top layer 45 are a plurality of contact regions, one of which is shown at 61, which extends to a conductive via 63, that forms part of an electrical interconnect network that extends through the wall portions to external recesses along the sidewalls of the tub, as will be described.

Electrical connections between the chip 15 and the surrounding wall portion of the tub are provided by means of leads, a respective one of which is shown at 19, bonded between the chip terminal pads 16 and the contact regions 61. Each contact region 61 is coupled to a wall-embedded electrical interconnect network comprised of an interconnected arrangement of conductive vias and printed interconnect metal on surfaces of the LTCC layers. One of these conductive vias, shown at 63, to which contact region 61 is connected, extends through each of layers 43 and 45 and terminates at the top surface 42 of layer 41. The conductive material used for the interconnect network may be any material customarily employed for LTCC applications, such as, but not limited to, gold, silver, platinum/gold and platinum/silver.

Extending along the top surface 42 of layer 41, from the termination of conductive via 63 to a further conductive via 65 within outer dielectric wall portion 35 to be described, is a layer of interconnect metal 67. As will be described below, by the provision of additional metal tracks, further conductive via 65 is coupled to recesses formed in outer sidewall portions of the tub, so that a continuous electrical communication path is provided between contact regions 61 and external access locations.

The second, outer wall portion 35 of the tub is shown as being formed of additional plural ones of LTCC layers 11, specifically a top layer 71 and an adjacent layer 73. Each of layers 71 and 73 has the shape of an annular frame defined by an inner edge 75 and an outer edge 77, which is aligned with the outer edges of the remaining layers of the tub. Top layer 71 of outer wall portion 35 has a plurality of generally semicircular (half-moon) recesses or pockets 81 distributed along an outer sidewall 83, each recess extending through the layer from outer edge 77 to a prescribed depth 85. Similarly, distributed along an outer sidewall 22 of bottom layer 21 are like plurality of recesses 87, each of which extends through the layer to a prescribed depth 89 (preferably corresponding to depth 85). Each of the recesses 81 exposes a peripheral surface portion 91 of the top surface 74 of layer 73 on which a layer of electrical interconnect 95 has been formed. Interconnect layer 95 extends from surface portion 91 of layer 73 to the further conductive via 65 that passes through plural ones of the layers 11 of the outer wall portion 35 of the laminate stack.

In particular, conductive via 65 passes through each of successively adjacent layers 73-45-43-41-23, that are intermediate top layer 71 and bottom layer 21 of the stacked laminate structure, and terminates at the bottom surface 28 of layer 23. An interconnect layer 101 is disposed on the bottom surface 28 of layer 23, extending from conductive via 65 to a surface portion 103 of the bottom surface 28 of layer 23 exposed by recesses 87. With interconnect layer 67 being disposed along the top surface 42 of layer 41 from conductive via 65 to conductive via 63, it can be seen that a dual interconnect path is provided between each terminal pad 16 of a die 15 and the exposed portion of interconnect layer 95 at recess 81 at the top peripheral edge 88 of the tub, and the exposed portion of interconnect layer 101 in recess 87 at the bottom peripheral edge 90 of the tub. This allows the tubs to be stacked on top of one another as shown in FIGS. 4 and 5, with chips that have been mounted in the tubs being selectively electrically interconnected to one another by the application of conductive material 97, such as conductive epoxy, to selected ones of aligned recesses 81/87 located at mutually adjacent top/bottom and bottom/top sidewall edge portions of the tubs.

Figure 4:
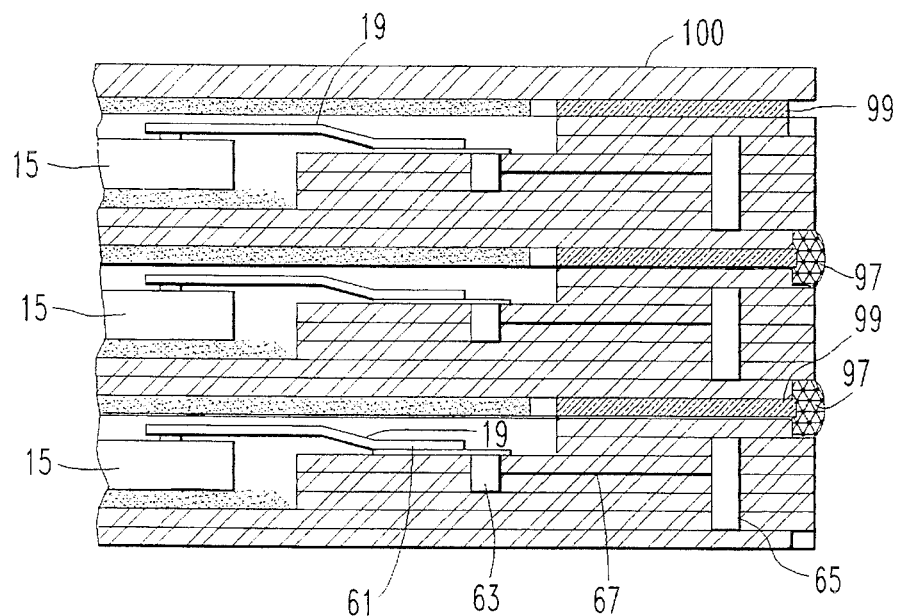
FIG. 4 is a diagrammatic sectional view of a stacked arrangement of plural ones of the multilayer LTCC tubs of FIG. 2.
Figure 5:
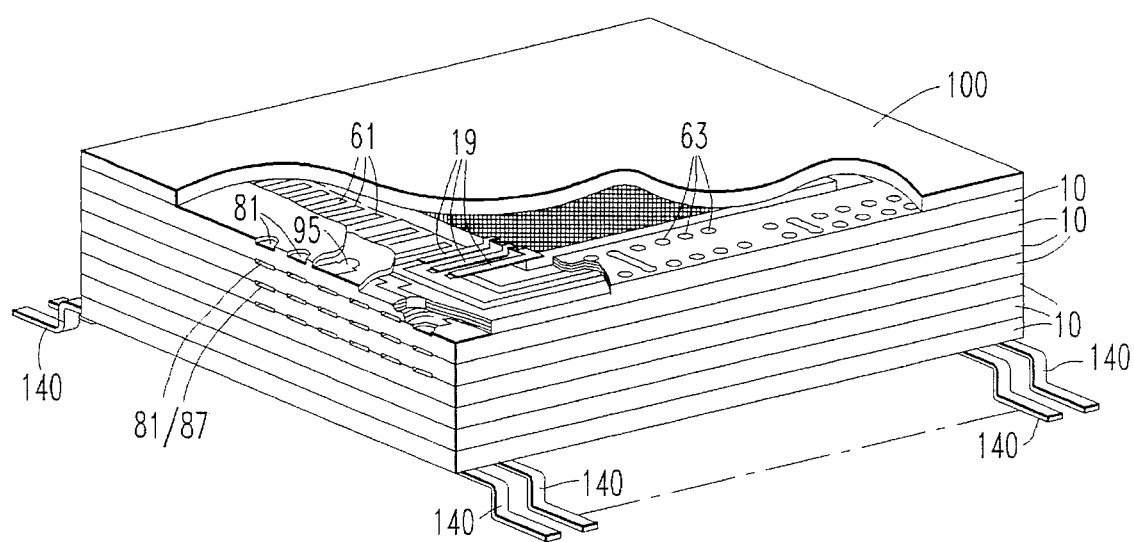
FIG. 5 is a diagrammatic perspective view of a stacked arrangement of plural ones of the multilayer LTCC tubs of FIG. 4.

As shown in the side view of FIG. 4, in order to form a stacked arrangement of plural ones of the multilayer LTCC tubs, a layer of mechanical bonding material 99, such as a glass frit, is applied between the bottom surface 25 of one tub and the top surface 92 of the outer wall portion of another tub, so that, when fired, the melted glass layer 99 provides a secure mechanical attachment between adjacent tubs and also hermetically seals the die that have been mounted on the interior floor portions of the tubs. The topmost tub of a stack of tubs may be hermetically sealed by means of an LTCC lid 100, to complete the packaging assembly.

Figure 6:
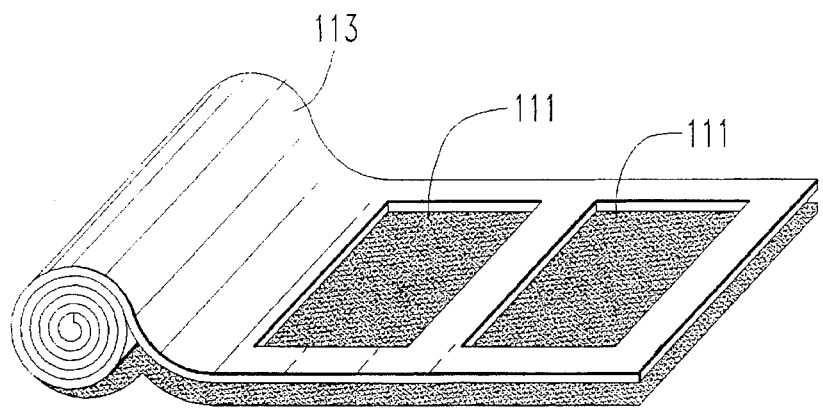
FIGS. 6–12 diagrammatically illustrate respective steps of a process for manufacture and assembly of the multilayer LTCC tub architecture of the present invention.
Figure 7:
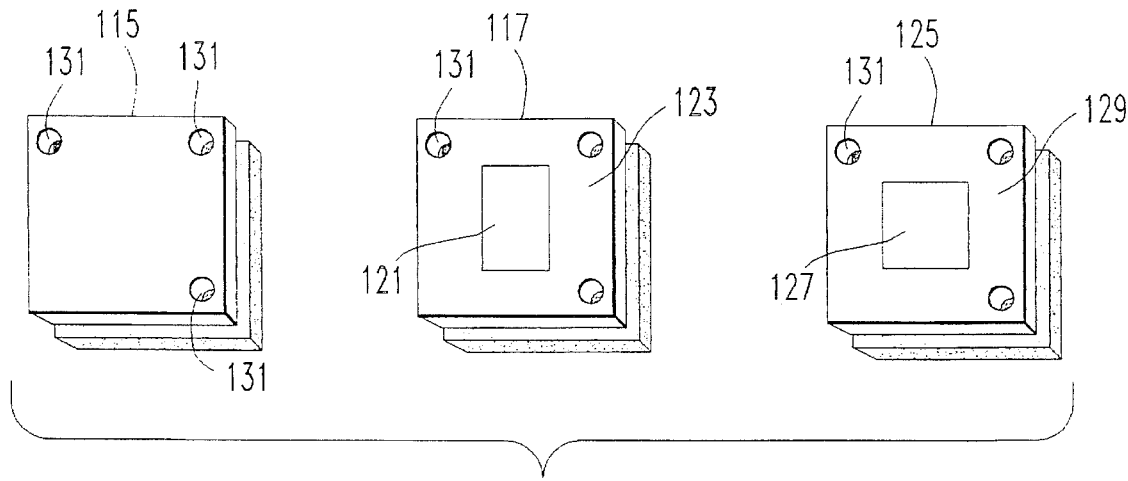

Respective steps of a process for manufacturing the multi-layer laminate configuration of the LTCC tub architecture of the present invention are diagrammatically illustrated FIGS. 6–12. As shown in FIG. 6, the process begins with the layout and knife-edge extraction of respective layer sections 111 of a roll 113 of LTCC material (Green Tape). For the tub architecture of FIGS. 1–5, three differently shaped layer sections 111 are cut from the tape. The first, shown at 115 in FIG. 7, has a generally solid rectangular (e.g. square) shape, corresponding to the shape of the bottom two layers 21 and 23 which form the floor portion of the tub. The second, shown at 117 in FIG. 7, has a generally rectangular frame shape, with a central rectangular aperture 121, surrounded by a rectangular annular portion 123. The third, shown at 125 in FIG. 7, also has a generally rectangular frame shape, with a central rectangular aperture 127, surrounded by a rectangular annular portion 129. Rectangular aperture 127 of the third layer section 125 is sized larger than the aperture 121 of the second layer section 117, so that, when placed atop the second layer section 121, the rectangular aperture 127 of the third layer section 125 will expose a portion of the rectangular annular portion 129 of the second layer section.

As shown in FIG. 2, for the exemplary embodiment, described above, an individual tub may comprise a stack of seven layers, the bottom two (21, 23) of which correspond to the bottom solid rectangular layers 115, the middle three (41, 43, 45) of which correspond to the second layer section 121, and the top two (71, 73) of which correspond to the third layer section 125. After the individual layer sections 111 have been extracted from the roll of Green Tape, orientation (alignment) holes 131 are punched into each layer section in order to provide alignment of the respective layers on a workframe during subsequent processing.

Figure 8:
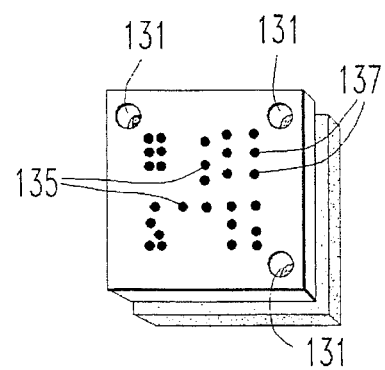

Next, as shown in FIG. 8, a prescribed pattern of via holes 135, 137 is punched into each respective layer. It should be observed that FIG. 8 and the following FIGS. are intended to be diagrammatic only and representative of a generic layer. The apertures of respective frame layers are not shown in order to simplify the drawings. The via holes include interior holes 135, such as those corresponding to the intended locations of vias 63 and 65, shown in the configuration of FIGS. 1–5, that are incorporated into the conductive via, interconnect distribution network through the wall portion of the tub, and also perimeter holes 137, from which the half-moon shaped recesses or pockets along the sidewalls of the top and bottom layers of the tub are to be formed.

Figure 9:
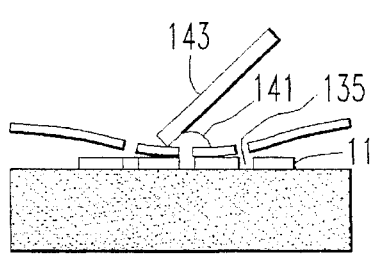
Figure 10:
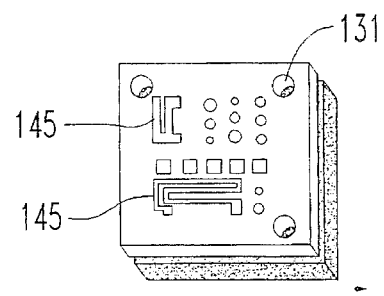
Figure 11:
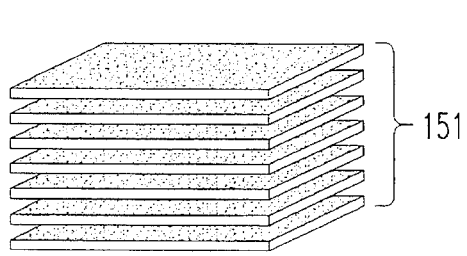

Once the via holes have been formed, the interior via holes 135 (located in layers other than the top and bottom layers of a tub) are filled with conductive material 141, such as silver or gold paste, as by way of a screen printing squeegee applicator 143, as shown in FIG. 9. Conductive track metal (e.g. silver or gold) patterns 145, to serve as the conductive tracks of the interconnect distribution network and the contact regions through which the die is to be connected to the interconnect distribution network, are next printed onto the LTCC layers in accordance with the network pattern selected for the die, as illustrated in FIG. 10. Any ground plane layer that may be employed is also plated at this time.

Figure 12:
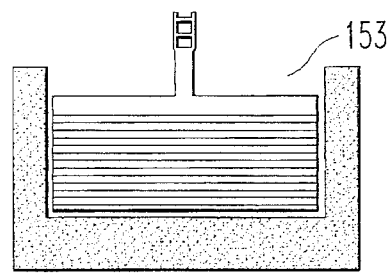

After electrically testing the respective layers for interconnect continuity, the metallized and via-filled layers of which a tub is to be formed are arranged in a stack 151 (FIG. 11) and the stack is placed in a lamination press, shown at 153 in FIG. 12. The press is then placed in a firing kiln, and the temperature is ramped to a temperature on the order of 400° C. in order to burn off the acrylic binder in the Green Tape layers. Further ramping of the temperature of the kiln to a temperature on the order of 850° C. melts the glass and solidifies the stack as a unitary structure. After this co-firing operation, the laminate assembly is removed from the press and subjected to a saw-cut operation along scribe lines that bisect the perimeter holes of the top and bottom layers, thereby forming the intended half-moon pockets at peripheral sidewalls of the top and bottom layers, as shown in FIGS. 1–5.

Figure 13:
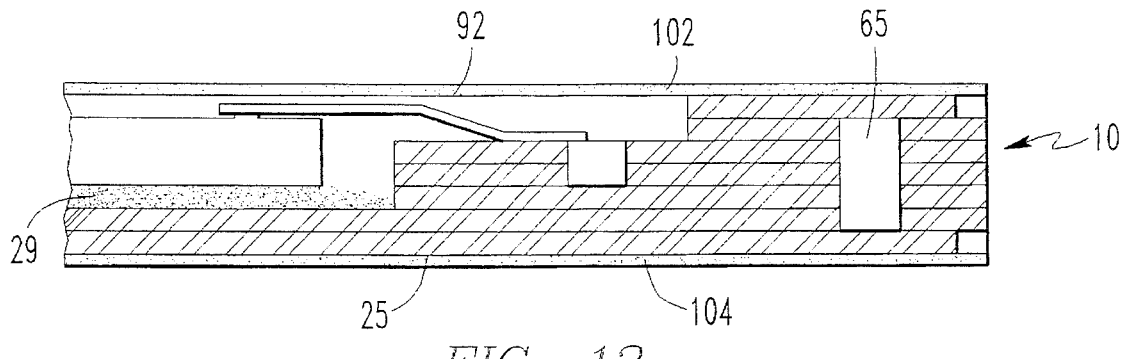
FIG. 13 shows the application of a layer of sealing glass in preparation for stacking of plural tubs into the multi-tub assembly of FIGS. 3 and 4.

Referring to FIG. 13, in preparation for stacking of plural tubs into a multi-tub assembly and die attachment in each tub, respective layers of sealing glass 102, 104 approximately 1–3 mils thick is deposited onto the top surface 92 of the outer wall portion 35 and in a matching pattern on the bottom surface 25 of the tub, so as to insure good adhesion of the glass to ceramic/glass matrix of the LTCC tub. In order for the tub assembly to be space-qualifiable, a non-outgassing (e.g. silver/glass or thermoplastic) die attach material 29 is dispensed onto the floor portion 26 of the tub. The die 15 is then set in place onto the die attachment material. Each of the tubs that make up a stack is placed in a belt furnace to dry and fire (or set) the die attachment material. The firing temperature may be on the order of 330° C. for thermoplastic material to 450° C. for silver/glass. In addition to adhering the die 15 to the floor portion of the tub, the die attachment material layer 29 serves to reinforce the floor portion of the tub, so as to enhance its mechanical integrity, thereby making the tub itself and the complete tub laminate assembly more robust against shock and vibration loads.

After die attachment, interconnect leads 15 are bonded to the terminal pads 16 of the die and contact regions 61 of the interior wall portion of the tub. Where the die is a memory chip, tape automated bonding (TAB) leads are utilized in order to minimize the profile height of the leads above the die, and thereby preventing shorting of bonding wires from lead wash or accidental compression of a lead wire against another or a backside (e.g. groundplane) metallization that may be present on an adjacent overlying tub. During the TAB process, the leads are supplied on the die prior to die attachment, with the die/lead frame being excised from a carrier just prior to placement.

As an alternative to TAB attachment, low profile wedge bonding may be employed; however, TAB provides greater reliability and pre-test capability or the bare die.

Each tub is again tested to insure that the die is acceptable. For testing a memory chip-containing tub, a simple probe card may be used. The test probes should contact the contact regions 61 at the outer lead bond area, in order to prevent damaging the die, or closing an open TAB lead, which would mask the open lead. Each die is preferably probed independently. Tubs with bad die are sorted from those tested as acceptable. In the case of a more complex die, such as a field programmable gate array (FPGA) die, probing of the system I/O ports, as well as the stack I/O connections is required. A field programmable gate array tub has a pad array on the bottom of the tub (not shown), which is configured to be interfaced with a 'bed-of-nails' or like test interface. A micro-probe may be used to contact the interconnect tracks exposed at the sidewall pockets in order to test I/O connections.

Upon completion of the testing operation, tubs preselected in accordance with the intended functionality of the overall multi-tub assembly are stacked on top of one another to form a laminated tub assembly as shown in FIG. 4. A signal processing/control circuit-containing tub is preferably placed at the bottom of the stack and one or more memory tubs are arranged on top of the bottom tub, with a lid 100 covering the top tub. A compression weight is then placed upon the lid in order to insure good contact between face-to-face glass layers of adjacent tubs (and the lid). Electrical interconnect cavities are filled and the resulting fixture/assembly is placed in a batch oven that has the capability of controlling temperature ramp-up rate, temperature dwell time, and oven temperature for the particular size stack and the glass material being employed. As the adhesion glass layer reaches its reflow temperature, it flows between each tub. With the compression weight compressing the stack of tubs, gaps are removed in the glass interface. This reflow and joining of the glass layers provides the intended hermetic seals of each tub/tub and tub/lid interface. After sealing, lead frames are attached to the bottom of the stack, as by means of a gold/tin solder braze performed in a belt furnace and using an alignment fixture to align the leads to the stack. In the multi-tub stack assembly of FIG. 5, the leads are shown at 140 as having a gull-wing shape.

As will be appreciated from the foregoing description, in accordance with the present invention, the drawbacks of conventional multi-chip packaging schemes are obviated by a new and improved 'tub'-like structure, that is configured to allow multiple die-containing tubs to be joined together in a hermetically sealed stack and selectively electrically interconnected at conductive pockets formed at top and bottom sidewall edge portions of adjacent tubs.

While we have shown and described an embodiment in accordance with the present invention, it is to be understood that the same is not limited thereto but is susceptible to numerous changes and modifications as known to a person skilled in the art, and we therefore do not wish to be limited to the details shown and described herein but intend to cover all such changes and modifications as are obvious to one of ordinary skill in the art.

What is claimed:

1. A packaging device for a semiconductor circuit chip comprising:

a floor member having a mounting surface portion upon which a semiconductor circuit chip is mountable; and a wall member surrounding and adjoining said floor member, so as to form therewith a tub-like structure, such that a semiconductor circuit chip mounted upon said mounting surface portion of said floor member is surrounded by said wall member, said wall member being comprised of an inner wall member portion adjacent to said mounting surface portion and extending a first height above said floor member, and an outer wall member portion adjoining said inner wall member and extending a second height above said floor member, greater than said first height, said inner wall member portion having one or more first contact regions formed on a first, top surface portion thereof, so that said one or more first contact regions may be electrically connectable to a semiconductor circuit chip mounted on the adjacent mounting surface region of said floor member, said outer wall member portion having one or more first recesses, at which one or more respective second contact regions are formed, said one or more first recesses extending from an outer edge of a top surface thereof along an outer sidewall of said outer wall member portion a first distance, which terminates and is thereby spaced above a bottom surface of said outer wall member portion, and one or more second recesses, aligned, along said outer sidewall of said outer wall member portion, with said one or more first recesses at which second recesses, one or more respective third contact regions are formed, said one or more second recesses extending from an outer edge of a bottom surface portion of said outer wall member along said outer sidewall of said outer wall member portion a second distance, which terminates and is thereby spaced below said top surface of said outer wall member portion, such that said one or more second recesses do not intersect said one or more first recesses aligned therewith, said wall member further including an electrical interconnection network which extends between said one or more first contact regions and said one or more second and third contact regions.

2. A packaging device, for a semiconductor circuit chip comprising:

a floor member having a mounting surface portion upon which a semiconductor circuit chip is mountable; and a wall member surrounding and adjoining said floor member, so as to form therewith a tub-like structure, such that a semiconductor circuit chip mounted upon said mounting surface portion of said floor member is surrounded by said wall member, said wall member being comprised of an inner wall member portion adjacent to said mounting surface portion and extending a first height above said floor member, and an outer wall member portion adjoining said inner wall member and extending a second height above said floor member, greater than said first height, said inner wall member portion having one or more first contact regions formed on a first, top surface portion thereof, so that said one or more first contact regions may be electrically connectable to a semiconductor circuit chip mounted on the adjacent mounting surface region of said floor member, said outer wall member portion having one or more first recesses, at which one or more respective second contact regions are formed, said one or more first recesses extending from an outer edge of a top surface thereof to a first prescribed depth along an outer sidewall thereof, and one or more second recesses, at which one or more respective third contact regions are formed, said one or more second recesses extending from an outer edge of a bottom surface portion of said outer wall member to a second depth along said outer sidewall, said wall member further including an electrical interconnection network which extends between said one or more first contact regions and said one or more second and third contact regions, and wherein said floor member is formed of one or more of a plurality of dielectric layers, and wherein said wall member is comprised of one or more of said plurality of dielectric layers disposed on and laminated together with the one or more layers of said floor member, with a bottom surface of a bottom one of said plurality of dielectric layers defining the bottom surface of said outer wall member, and a top surface of a top one of said plurality of dielectric layers defining the top surface of said outer wall member.

3. A package assembly according to claim 2, wherein said inner wall member portion is formed of one or more of said plurality of dielectric layers disposed on said floor member, and said outer wall member portion is formed of one or more of said plurality of dielectric layers disposed on said inner wall member.

4. A package assembly according to claim 3, wherein said electrical interconnection network comprises one or more conductive vias which extend through one or more layers of said wall member, and conductive layers disposed on selected ones of said plurality of dielectric layers and being electrically connected to said one or more conductive vias and said one or more first, second and third contact regions.

5. A package assembly according to claim 4, wherein said dielectric layers comprise low temperature co-fired ceramic layers.

6. A packaging device, for a semiconductor circuit chip comprising:

a floor member having a mounting surface portion upon which a semiconductor circuit chip is mountable; and a wall member surrounding and adjoining said floor member, so as to form therewith a tub-like structure, such that a semiconductor circuit chip mounted upon said mounting surface portion of said floor member is surrounded by said wall member, said wall member being comprised of an inner wall member portion adjacent to said mounting surface portion and extending a first height above said floor member, and an outer wall member portion adjoining said inner wall member and extending a second height above said floor member, greater than said first height, said inner wall member portion having one or more first contact regions formed on a first, top surface portion thereof, so that said one or more first contact regions may be electrically connectable to a semiconductor circuit chip mounted on the adjacent mounting surface region of said floor member, said outer wall member portion having one or more first recesses, at which one or more respective second contact regions are formed, said one or more first recesses extending from an outer edge of a top surface thereof to a first prescribed depth along an outer sidewall thereof, and one or more second recesses, at which one or more respective third contact regions are formed, said one or more second recesses extending from an outer edge of a bottom surface portion of said outer wall member to a second depth along said outer sidewall, said wall member further including an electrical interconnection network which extends between said one or more first contact regions and said one or more second and third contact regions, and wherein said floor member and said wall member are formed of a stacked laminate of a plurality of low temperature co-fired ceramic layers.

7. A package assembly according to claim 6, wherein each of said floor member, said inner wall member portion, and said outer wall member portion is formed of plural low temperature co-fired ceramic layers.

8. A package assembly according to claim 1, further including a lid hermetically sealed to the top surface of said wall member.

9. A packaging and interconnect assembly for a plurality of semiconductor circuit chips comprising:

a plurality of stacked tub-configured structures, each tub-configured structure including a floor member having a mounting surface portion upon which a semiconductor circuit chip is mountable, and a wall member surrounding and adjoining said floor member, so as to form therewith a tub-configured structure, such that a semiconductor circuit chip mounted upon said mounting surface portion of said floor member is surrounded by said wall member, said wall member being comprised of an inner wall member portion adjacent to said mounting surface portion and extending a first height above said floor member, and an outer wall member portion adjoining said inner wall member and extending a second height above said floor member, greater than said first height, said inner wall member portion having one or more first contact regions formed on a first, top surface portion thereof, so that said one or more first contact regions may be electrically connectable to a semiconductor circuit chip mounted on the adjacent mounting surface region of said floor member, said outer wall member portion having one or more first recesses, at which one or more respective second contact regions are formed, said one or more first recesses extending from an outer edge of a top surface thereof to a first prescribed depth along an outer sidewall thereof, and one or more second recesses, at which one or more respective third contact regions are formed, said one or more second recesses extending from an outer edge of a bottom surface portion of said outer wall member to a second depth along said outer sidewall, said wall member further including an electrical interconnection network which extends between said one or more first contact regions and said one or more second and third contact regions; and wherein said plurality of tub-configured structures are stacked atop one another such that the bottom surface of the outer wall member portion of one tub-configured structure is disposed upon the top surface of an outer wall member portion of another tub-configured structure, so that a second recess of the outer wall member portion of said one tub-configured structure is adjacent to a first recess of the outer wall member portion of said another tub-configured structure, and wherein conductive material is provided at selected adjacent first and second recesses, so as to electrically connect electrical interconnect networks of selected one and another tub-configured structures, and thereby provide electrical interconnections between selected semiconductor circuit chips mounted in the tub-configured structures of said stack.

10. A packaging and interconnect assembly according to claim 9, wherein a floor member of a respective tub-configured structure is formed of one or more of a plurality of dielectric layers, and wherein said wall member is comprised of one or more of said plurality of dielectric layers disposed on and laminated together with the one or more layers of said floor member, with a bottom surface of a bottom one of said plurality of dielectric layers defining the bottom surface of said outer wall member, and a top surface of a top one of said plurality of dielectric layers defining the top surface of said outer wall member.

11. A packaging and interconnect assembly according to claim 10, wherein said inner wall member portion is formed of one or more of said plurality of dielectric layers disposed on said floor member, and said outer wall member portion is formed of one or more of said plurality of dielectric layers disposed on said inner wall member.

12. A packaging and interconnect assembly according to claim 11, wherein said electrical interconnection network comprises one or more conductive vias which extend through one or more layers of said wall member, and conductive layers disposed on selected ones of said plurality of dielectric layers and being electrically connected to said one or more conductive vias and said one or more first, second and third contact regions.

13. A packaging and interconnect assembly according to claim 12, wherein said dielectric layers comprise low temperature co-fired ceramic layers.

14. A packaging and interconnect assembly according to claim 9, wherein said floor member and said wall member are formed of a stacked laminate of a plurality of low temperature co-fired ceramic layers.

15. A packaging and interconnect assembly according to claim 14, wherein each of said floor member, said inner wall member portion, and said outer wall member portion is formed of plural low temperature co-fired ceramic layers.

16. A packaging and interconnect assembly according to claim 9, further including a lid hermetically sealed to the top surface of the outer wall member portion of a topmost one of the stacked tub-configured structures.

17. A packaging and interconnect assembly according to claim 9, wherein said plurality of tub-configured structures are stacked atop one another with respective layers of hermetically sealing material between successive tub-configured structures, such that the bottom surface of the outer wall member portion of one tub-configured structure is joined with a hermetically sealing material disposed upon the top surface of an outer wall member portion of another tub-configured structure.

* * * * *